(12) United States Patent
Morimoto et al.

(10) Patent No.: US 8,377,269 B2
(45) Date of Patent: Feb. 19, 2013

(54) SPUTTERING APPARATUS

(75) Inventors: Naoki Morimoto, Shizuoka (JP);
Tomoyasu Kondo, Shizuoka (JP);
Hideto Nagashima, Shizuoka (JP);
Daisuke Mori, Shizuoka (JP); Akifumi Sano, Shizuoka (JP)

(73) Assignee: Ulvac, Inc., Kanagawa (JP)

( * ) Notice: Subject to any disclaimer, the term of this patent is extended or adjusted under 35 U.S.C. 154(b) by 199 days.

(21) Appl. No.: 12/991,961

(22) PCT Filed: Jun. 4, 2009

(86) PCT No.: PCT/JP2009/060283
§ 371 (c)(1),
(2), (4) Date: Nov. 10, 2010

(87) PCT Pub. No.: WO2009/150997
PCT Pub. Date: Dec. 17, 2009

(65) Prior Publication Data
US 2011/0062019 A1    Mar. 17, 2011

(30) Foreign Application Priority Data
Jun. 11, 2008   (JP) ................................ 2008-153198

(51) Int. Cl.
*C23C 14/35*     (2006.01)
(52) U.S. Cl. ......... 204/298.06; 204/298.08; 204/298.14; 204/298.19; 204/298.2; 204/298.16; 204/298.11
(58) Field of Classification Search ............ 204/298.06, 204/298.08, 298.14, 298.16, 298.19, 298.2, 204/298.11
See application file for complete search history.

(56) References Cited

U.S. PATENT DOCUMENTS

| | | | |
|---|---|---|---|
| 5,710,486 A * | 1/1998 | Ye et al. ................. | 315/111.21 |
| 5,744,017 A | 4/1998 | Tamagaki et al. | |
| 6,020,686 A | 2/2000 | Ye et al. | |

FOREIGN PATENT DOCUMENTS

| | | |
|---|---|---|
| JP | 7-166348 A | 6/1995 |
| JP | 7-173618 A | 7/1995 |

(Continued)

OTHER PUBLICATIONS

International Search Report for PCT Patent App. No. PCT/JP2009/060283 (Sep. 1, 2009).

*Primary Examiner* — Rodney McDonald
(74) *Attorney, Agent, or Firm* — Cermak Nakajima LLP; Tomoko Nakajima

(57) ABSTRACT

There is provided an inexpensive sputtering apparatus in which self-sputtering can be stably performed by accelerating the ionization of the atoms scattered from a target. The sputtering apparatus has: a target which is disposed inside a vacuum chamber so as to lie opposite to the substrate W to be processed; a magnet assembly which forms a magnetic field in front of the sputtering surface of the target; and a DC power supply which charges the target with a negative DC potential. A first coil is disposed in a central portion of a rear surface of the sputtering surface of the target. The first coil is electrically connected between the first power supply and the output to the target. When a negative potential is charged to the target by the sputtering power supply, the electric power is charged to the first coil, whereby a magnetic field is generated in front of the sputtering surface.

2 Claims, 1 Drawing Sheet

FOREIGN PATENT DOCUMENTS

| | | |
|---|---|---|
| JP | 9-74089 A | 3/1997 |
| JP | 2000-144411 A | 5/2000 |
| JP | 2007-308746 A | 11/2007 |
| WO | WO95/04368 A1 | 2/1995 |

* cited by examiner

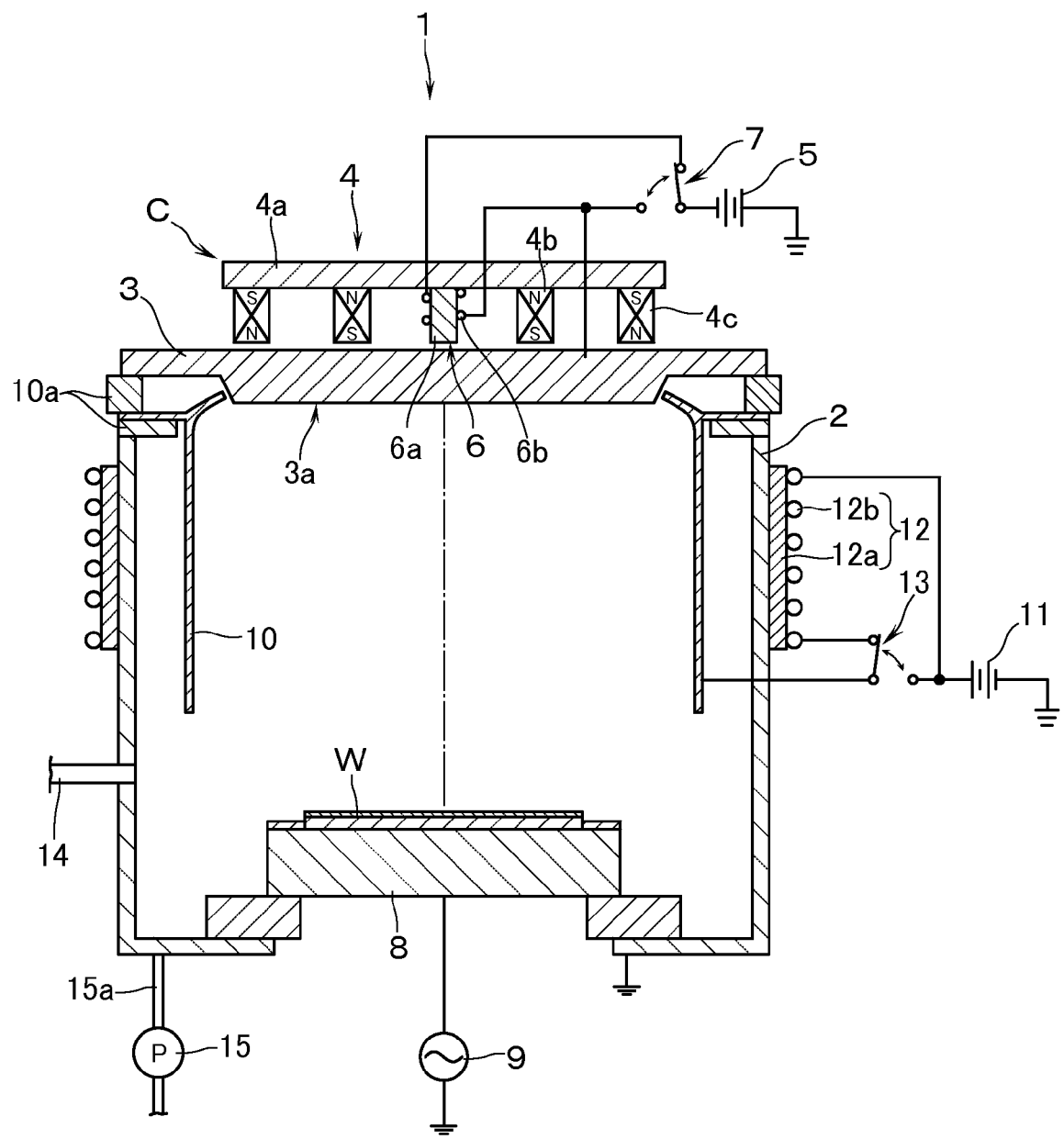

SPUTTERING APPARATUS

This application is a national phase entry under 35 U.S.C. §371 of PCT Patent Application No. PCT/JP2009/060283, filed on Jun. 4, 2009, which claims priority under 35 U.S.C. §119 to Japanese Patent Application No. 2008-153198, filed Jun. 11, 2008, both of which are incorporated by reference.

TECHNICAL FIELD

The present invention relates to a sputtering apparatus and, in particular, to a DC magnetron sputtering apparatus which is capable of stably performing self sputtering.

BACKGROUND ART

As a result of recent trend for finer design of wiring patterns, requirement is made of an improvement in in-plane uniformity of coverage. As a method of materializing this kind of requirements, it is known to use a DC magnetron sputtering apparatus which utilizes the art of, e.g., self-ionized plasma (SIP). According to the SIP art, by charging a high potential in a magnetic field which is high in electron containment capacity, high-density plasma is materialized.

As an apparatus for stably performing the above-mentioned self sputtering, the following art is known in Patent Document 1. That is, in addition to forming a magnetic field in front of a sputtering surface of a target by disposing a magnet assembly on a side opposite to the sputtering surface of the target, there is disposed a coil on the side surface of the vacuum chamber. By charging electric power to the coil through a power supply for the coil, a magnetic field vertical to the sputtering surface is generated. The ionization of the atoms scattered from the target will thus be accelerated.

However, in the above-mentioned apparatus described in Patent Document 1, the electric power supply is separately provided for charging the coil with electric power. Therefore, there is a problem in that the cost of the sputtering apparatus becomes higher. In addition, in order to adjust the direction of the magnetic field or the intensity of the magnetic field, there will be needed an electric current control circuit for controlling the electric current to be charged to coil, thereby bringing about a further increase in cost.

Patent Document 1: JP-A-2000-144411

DISCLOSURE OF THE INVENTION

Problems to be Solved by the Invention

In view of the above-mentioned points, this invention has a problem of providing an inexpensive sputtering apparatus which is capable of accelerating the ionization of the atoms scattered from the target, thereby stably performing the self sputtering.

Means for Solving the Problems

In order to solve the above-mentioned problems, the sputtering apparatus of this invention comprises: a target disposed inside a vacuum chamber in a manner to lie opposite to a substrate to be processed; a magnet assembly which forms a magnetic field in front of a sputtering surface of the target; and a first power supply which charges the target with a negative DC potential. A first coil is disposed on a rear side of the sputtering surface of the target, the first coil being electrically connected between the first power supply and an output to the target. When the target is charged with a negative potential by the first power supply, the first coil is electrically charged, whereby a magnetic field is generated in front of the sputtering surface.

According to this invention, when a negative potential that has been set in advance is charged, e.g., to the target by the first power supply, electric current depending on the charged potential to the target and the plasma impedance will flow through the first coil, thereby generating a magnetic field. As a result, the intensity of the magnetic field generated in front of the sputtering surface of the target can be increased or decreased by the magnet assembly. In this case, if the electric current to flow through the first coil is controlled by appropriately adjusting the electric power charged to the target, or if the direction of the electric current to flow through the first coil is changed, a vertical magnetic field can be generated relative to the sputtering surface of the target at an arbitrary intensity of the magnetic field.

As described hereinabove, according to this invention, since an arrangement has been employed in which the first coil is charged with electricity when the target is charged with a negative potential, power supply for the coil is not needed. Further, since the electric current to the first coil can be increased or decreased depending on the electric power to be charged to the target, a circuit for controlling the electric current to the first coil is neither required, thereby attaining a further reduction in cost.

Preferably, this invention further comprises: an electrode which is disposed inside the vacuum chamber in a manner to enclose a space in front of the sputtering surface between the target and the substrate; and a second power supply which charges the electrode with a positive DC potential. A second coil is disposed along a side wall of the vacuum chamber, the second coil being electrically connected between the second power supply and an output to the electrode. When the electrode is charged with a positive potential by the second power supply, the second coil is electrically charged, whereby a magnetic field is generated in front of the sputtering surface.

According to this arrangement, as a result of the electric current to flow through the second coil by the second power supply, a magnetic field is generated in the space between the target and the substrate. In this case, if the electric current to flow through the second coil is controlled by appropriately adjusting the electric power to be charged to the electrode, or if the direction of the electric current to flow through the second coil is changed, a vertical magnetic field can be generated relative to the sputtering surface of the target at an arbitrary intensity of the magnetic field. As a result, there can be materialized an inexpensive sputtering apparatus which can accelerate the ionization of the atoms scattered from the target, thereby stably performing self sputtering.

Preferably, the sputtering apparatus of this invention further comprises a switching means for switching power supply to the first coil and the second coil, respectively. Then, there can be materialized an arrangement in which electric power can be arbitrarily charged to the first coil and the second coil. In this case, not only the switching of electric power, but also the direction of the electric current to flow through the coils may be arranged to be switched over.

BEST MODE FOR CARRYING OUT THE INVENTION

With reference to the drawing, a description will now be made of a sputtering apparatus according to an embodiment of this invention. As shown in FIG. 1, the sputtering apparatus 1 is of a DC magnetron sputtering system capable of performing self-sputtering, and is provided with a vacuum chamber 2 that is capable of forming therein a vacuum atmosphere. On a ceiling portion of the vacuum chamber 2 there is mounted a cathode unit C. The cathode unit C is made up of a target 3 and a magnet assembly 4 which forms a magnetic field in front of a sputtering surface 3a of the target 3.

The target 3 is made of a material, e.g., of Cu, that is appropriately selected depending on the composition of a thin film to be formed on a substrate W to be processed. The target 3 is manufactured in a known method into a predetermined shape. Further, the target 3 is electrically connected to a DC power supply 5 which is defined as a first power supply, and is arranged to be charged with a predetermined negative potential. The magnet assembly 4 is disposed on a side that lies opposite to the sputtering surface 3a, and is made up of: a plate-shaped yoke 4a which is disposed in parallel with the target 3; and ring-shaped magnets 4b, 4c which are concentrically disposed on an under surface of the yoke 4a while changing the polarity on the side of the target. The shape and number of the magnets 4b, 4c are appropriately selected depending on the magnetic field to be formed in front of the target 3; for example, a thin-piece shaped one or a bar-shaped one, or a combination thereof may appropriately be used.

In the central portion of the yoke 4a (in this embodiment, in a position on the center line that passes through the center of the target 3), there is provided a first coil 6 which is formed by winding a wire 6b on the periphery of a cylindrical core material 6a of a magnetic material. The position of the first coil 6 may appropriately be changed depending on the layout of the magnet assemblies 4b, 4c. Both ends of the wire 6b are electrically connected from the DC power supply 5 to an output to the target 3 through a changeover switch (switching means) 7. When a predetermined negative potential that is set in advance is charged to the target 3 by the DC power supply 5, an electric current corresponding to the potential charged to the target 3 and corresponding to the plasma impedance flows through the first coil 6, whereby a magnetic field is generated. Although not illustrated, preferably, another changeover switch having a known construction is further provided so that the direction of flow of the electric current through the first coil 6 can be inverted.

According to this arrangement, the intensity of the magnet field to be generated in front of the sputtering surface 3a of the target 3 can be increased or decreased by the magnet assembly 4. In this case, if the electric current to flow through the first coil 6 is controlled by appropriately adjusting the electric power charged to the target 3 or if the direction of electric current to flow through the first coil 6 is changed after having appropriately set the number of turns of the wire 6b, a vertical magnetic field can be generated relative to the sputtering surface 3a of the target 3 at a predetermined strength of the magnetic field.

According to the embodiment of this invention as described above, an arrangement has been employed in which the first coil 6 is energized when the target 3 is charged with a negative potential. Therefore, there is required no power supply for the coil. In addition, since the electric current to the first coil 6 is increased or decreased depending on the electric power charged to the target 3, there is neither required a control circuit for the electric current to the first coil 6. It is thus possible to attain a cost reduction.

In addition, at the bottom of the vacuum chamber 2, there is disposed a stage 8 in a manner to lie opposite to the target 3 so that the substrate W such as a silicon wafer and the like to be processed can be held in position. The stage 8 is electrically connected to a high-frequency power supply 9 having a known construction. It is thus so arranged that, during sputtering, a predetermined bias potential can be charged to the stage 8, and consequently to the substrate W.

Further, inside the vacuum chamber 2 there is provided an electrode in the form of an ion reflector 10 in a manner to enclose the space in front of the sputtering surface 3a between the sputtering surface 3a of the target 3 and the substrate W. The ion reflector 10 is of a substantially cylindrical shape which has an inner diameter larger than the outside diameter of the target 3, and is mounted on the vacuum chamber 2 through an electrical insulator 10a in a manner to lie along the wall surface of the vacuum chamber 2. The ion reflector 10 is electrically connected to another DC power supply 11 which is defined as a second electrode so that a predetermined positive electric potential can be charged thereto.

On an outer wall of the vacuum chamber 2 there is provided a second coil 12 which is made by winding a wire 12b about a ring-shaped yoke 12a which is made of a magnetic material and which is disposed so as to be positioned between the target 3 and the stage 8. Both ends of the coil 12b are electrically connected through another changeover switch (switching means) from the DC power supply 11 to the output to the ion reflector 10. In case a predetermined positive potential is charged by the DC power supply 11 to the ion reflector 10, electric current flows through the second coil 12 so that a predetermined positive potential is charged to the ion reflector 10. As a result, a magnetic field is generated in a space between the sputtering surface 3a and the substrate W. In this case, although not illustrated, preferably still another changeover switch having a known construction is disposed so that the direction of the electric current to the second coil 12 can be reversed.

According to the above, after having appropriately set the number of winding of the wire 6b, if control is made of the electric current to flow through the second coil 12 by appropriately adjusting the electric power to be charged to the ion reflector 10, or by changing the direction of the electric current to flow through the second coil 12, the vertical magnetic field can be generated relative to the sputtering surface 3a of the target 3 at a predetermined strength of magnetic field. As a result, there can be materialized an inexpensive sputtering apparatus 1 in which the ionization of the atoms scattered out of the target 3 can be accelerated to thereby stably perform the self-sputtering.

To the side wall of the vacuum chamber 2 there is connected a gas pipe 14 which introduces a sputtering gas such as argon gas. The other end of the gas pipe is in communication with the gas source through a mass flow controller (not illustrated). In addition, the vacuum chamber 2 has connected thereto an exhaust pipe 15a which is in communication with the vacuum exhaust means 15 which is made up of a turbo-molecular pump, a rotary pump, and the like.

Next, a description will now be made of thin film forming by using the above-mentioned sputtering apparatus 1 by way of an example in which a Cu film is formed on a substrate W. First, after having placed the substrate W in position on the stage 8, the vacuum exhaust means 15 is operated to evacuate the vacuum chamber 2 to a predetermined vacuum degree (e.g., $10^{-5}$ Pa). When the pressure in the vacuum chamber 2 has reached a predetermined value, a predetermined negative potential is charged (charging of electric power) from the DC power supply 5 to the target 3 while introducing a sputtering gas such as argon gas and the like into the vacuum chamber 2, whereby a plasma atmosphere is formed inside the vacuum chamber 2. At this time, the change-over switch 7 is switched so that electric power is charged to the first coil 6 to generate a magnetic field. By means of the magnet assembly 4 the intensity of the magnetic field that has been generated in front of the sputtering surface 3a of the target 3 is increased.

Together with the above-mentioned processing, the stage 8 is charged by the bias power supply 9 with a bias electric potential and, at the same time, the ion reflector 10 is charged by the DC power supply 11 with a predetermined positive potential. At this time, the change-over switch 13 is switched to thereby charge the second coil 12 with electric power, whereby a vertical magnetic field is generated relative to the sputtering surface 3a of the target 3.

Then, by causing the argon ions in the plasma to collide with the sputtering surface 3a to thereby sputter the sputtering surface 3a, the copper atoms are scattered out of the sputtering surface 3a. As a result, the copper atoms which are the sputtered particles travel toward the substrate W to thereby adhere to, and deposit on, the surface of the substrate W. During sputtering, by means of the magnetic field of the magnet assembly 4 and of both the first and second coils 6, 12, the electrons ionized in front of the sputtering surface 3a and the secondary electrons generated by sputtering will be collected and, as a result, the plasma in front of the sputtering surface 3a becomes high in density.

In this embodiment, a description has so far been made of an example in which the first coil 6 was disposed in the central portion of the rear surface of the target 3 and in which the second coil 12 was disposed on the side wall of the vacuum chamber 2. Without being limited thereto, the position of the coils may be arbitrarily set. Further, as long as the magnetic field can be generated by passing electric power through the coils, this invention can be applied.

BRIEF DESCRIPTION OF THE DRAWING

FIG. 1 is a schematic sectional view of a sputtering apparatus according to one embodiment of this invention.

DESCRIPTION OF REFERENCE NUMERALS AND CHARACTERS

1 DC magnetron sputtering apparatus
2 vacuum chamber
3 target
3a sputtering surface
4 magnet assembly
5, 11 DC power supply (each of the first and second power supplies)
6, 12 each of the first and second coils
7, 13 change-over switch (switching means)
10 ion reflector (electrode)
C cathode unit
W substrate

What is claimed is:

1. A sputtering apparatus comprising:
a target disposed inside a vacuum chamber in a manner to lie opposite to a substrate to be processed;
a magnet assembly which forms a magnetic field in front of a sputtering surface of the target;
a first power supply which charges the target with a negative DC potential;
an electrode which is disposed inside the vacuum chamber in a manner to enclose a space in front of the sputtering surface between the target and the substrate; and
a second power supply which charges the electrode with a positive DC potential,
wherein a first coil is disposed on a rear side of the sputtering surface of the target, the first coil being electrically connected between the first power supply and an output to the target,
wherein, when the target is charged with a negative potential by the first power supply, the first coil is electrically charged, whereby a magnetic field is generated in front of the sputtering surface,
wherein a second coil is disposed along a side wall of the vacuum chamber, the second coil being electrically connected between the second power supply and an output to the electrode, and
wherein, when the electrode is charged with a positive potential by the second power supply, the second coil is electrically charged, whereby a magnetic field is generated in front of the sputtering surface.

2. The sputtering apparatus according to claim 1, further comprising switching means for switching power supply to the first coil and the second coil, respectively.

* * * * *